United States Patent
Jung et al.

(10) Patent No.: US 10,720,110 B2
(45) Date of Patent: Jul. 21, 2020

(54) ELECTROLUMINESCENT DISPLAY AND METHOD OF DRIVING THE SAME

(71) Applicant: LG Display Co., Ltd., Seoul (KR)

(72) Inventors: Hwajun Jung, Incheon (KR); Youngsun Jang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 213 days.

(21) Appl. No.: 15/853,757

(22) Filed: Dec. 23, 2017

(65) Prior Publication Data

US 2018/0182303 A1 Jun. 28, 2018

(30) Foreign Application Priority Data

Dec. 28, 2016 (KR) .................. 10-2016-0181121

(51) Int. Cl.
*G09G 3/3291* (2016.01)
*G09G 3/3258* (2016.01)
(Continued)

(52) U.S. Cl.
CPC ......... *G09G 3/3291* (2013.01); *G09G 3/3233* (2013.01); *G09G 3/3258* (2013.01); *G09G 2300/0819* (2013.01); *G09G 2300/0842* (2013.01); *G09G 2300/0861* (2013.01); *G09G 2310/027* (2013.01); *G09G 2310/08* (2013.01); *G09G 2320/0233* (2013.01); *G09G 2320/0247* (2013.01); *G09G 2320/0285* (2013.01); *G09G 2320/0295* (2013.01);
(Continued)

(58) Field of Classification Search
None
See application file for complete search history.

(56) References Cited

U.S. PATENT DOCUMENTS 3,096,475 A * 7/1963 Brooks .................. G05F 1/573
323/269
2001/0041377 A1* 11/2001 Ono .................. H01L 21/26513
438/14

(Continued)

FOREIGN PATENT DOCUMENTS

| CN | 105513536 A | 4/2016 |
| JP | 2014-029533 A | 2/2014 |

(Continued)

OTHER PUBLICATIONS

Extended European Search Report, dated May 4, 2018 for the European patent application No. 17207915.4.

Primary Examiner — Dorothy Harris
(74) Attorney, Agent, or Firm — Polsinelli PC

(57) ABSTRACT

An electroluminescent display and a method of driving the same are disclosed. The electroluminescent display includes a display panel including a plurality of pixels electrically connected to a plurality of data lines and a plurality of gate lines. Each pixel includes a driving element adjusting a current of a light emitting element depending on a gate-to-source voltage, and a switching element supplying a second voltage to the driving element in response to a gate-on voltage of an emission control signal. The switching element is turned off in response to a gate-off voltage of the emission control signal during a real-time compensation time. A source voltage of the driving element is changed during the real-time compensation time.

13 Claims, 13 Drawing Sheets

(51) Int. Cl.
  *G09G 3/3233* (2016.01)
  *H01L 27/32* (2006.01)
(52) U.S. Cl.
  CPC . *G09G 2320/041* (2013.01); *G09G 2320/043* (2013.01); *G09G 2320/045* (2013.01); *G09G 2320/064* (2013.01); *G09G 2360/16* (2013.01); *H01L 27/3276* (2013.01)

(56) References Cited

U.S. PATENT DOCUMENTS

| | | | | |
|---|---|---|---|---|
| 2005/0052377 | A1* | 3/2005 | Hsueh | G09G 3/3233 345/82 |
| 2007/0195020 | A1* | 8/2007 | Nathan | G09G 3/3233 345/76 |
| 2008/0036708 | A1* | 2/2008 | Shirasaki | G09G 3/3233 345/76 |
| 2011/0057966 | A1* | 3/2011 | Ono | G09G 3/3233 345/690 |
| 2011/0084955 | A1* | 4/2011 | Kim | G09G 3/3283 345/212 |
| 2013/0162617 | A1 | 6/2013 | Yoon et al. | |
| 2014/0139510 | A1* | 5/2014 | Han | G09G 3/3291 345/212 |
| 2014/0160093 | A1* | 6/2014 | Chaji | G09G 3/3258 345/204 |
| 2014/0176523 | A1 | 6/2014 | Kwak | |
| 2014/0176525 | A1* | 6/2014 | Woo | G09G 3/3291 345/212 |
| 2015/0294625 | A1 | 10/2015 | Lee et al. | |
| 2016/0203764 | A1 | 7/2016 | In et al. | |
| 2016/0351122 | A1 | 12/2016 | Jung et al. | |
| 2018/0061312 | A1* | 3/2018 | He | G09G 3/325 |

FOREIGN PATENT DOCUMENTS

| | | |
|---|---|---|
| KR | 10-2011-0080388 A | 7/2011 |
| KR | 10-2012-0042084 A | 5/2012 |
| KR | 10-1411621 B1 | 7/2014 |
| KR | 10-2016-0067307 A | 6/2016 |
| WO | 2015/083136 A1 | 6/2015 |
| WO | 2017/133280 A1 | 8/2017 |

* cited by examiner

ELECTROLUMINESCENT DISPLAY AND METHOD OF DRIVING THE SAME

CROSS-REFERENCE TO RELATED APPLICATION

This application claims the benefit of Korean Patent Application No. 10-2016-0181121 filed on Dec. 28, 2016, the entire contents of which is incorporated herein by reference for all purposes as if fully set forth herein.

BACKGROUND

Field of the Disclosure

The present disclosure relates to a display device, and more particularly, to an electroluminescent display device and a method of driving the same.

Description of the Background

An electroluminescent display device is classified into an inorganic electroluminescent display device and an organic electroluminescent display device depending on a material of an emission layer. An active matrix organic light emitting diode (OLED) display includes a plurality of OLEDs capable of emitting light by themselves as a general electroluminescent diode and has many advantages, such as fast response time, high emission efficiency, high luminance, wide viewing angle, and the like.

An OLED serving as a self-emitting element includes an anode electrode, a cathode electrode, and an organic compound layer between the anode electrode and the cathode electrode. The organic compound layer generally includes a hole injection layer HIL, a hole transport layer HTL, an emission layer EML, an electron transport layer ETL, and an electron injection layer EIL. When a power voltage is applied to the anode electrode and the cathode electrode, holes passing through the hole transport layer HTL and electrons passing through the electron transport layer ETL move to the emission layer EML and combine, thereby forming excitons. As a result, the emission layer EML generates visible light by the excitons.

An OLED display includes a plurality of pixels, each including an OLED and a driving thin film transistor (TFT), in a matrix form and adjusts a luminance of an image implemented on the pixels based on a grayscale of image data. The driving TFT controls a driving current flowing in the OLED depending on a voltage (hereinafter, referred to as "a gate-to-source voltage") between a gate electrode and a source electrode of the driving TFT. An amount of light emitted by the OLED and a luminance of an image are determined depending on the driving current of the OLED.

In general, when a driving TFT operates in a saturation region, a driving current Ids flowing between a drain electrode and a source electrode of the driving TFT is expressed as follows:

$$Ids=(½)*(\mu*C*W/L)*(Vgs-Vth)^2$$

In the above Equation, $\mu$ is electron mobility, "C" is a capacitance of a gate insulating layer, "W" is a channel width of the driving TFT, and "L" is a channel length of the driving TFT. And, Vgs is a gate-to-source voltage of the driving TFT, and Vth is a threshold voltage (or a critical voltage) of the driving TFT. The gate-to-source voltage Vgs of the driving TFT may be a voltage differential between a data voltage and a reference voltage depending on a pixel structure. The data voltage is an analog voltage corresponding to a grayscale of image data, and the reference voltage is a fixed voltage. Therefore, the gate-to-source voltage Vgs of the driving TFT is programmed or set depending on the data voltage. Then, the driving current Ids is determined based on the programmed gate-to-source voltage Vgs.

Electrical characteristics of the pixel, such as a threshold voltage Vth and an electron mobility $\mu$ of the driving TFT and a threshold voltage of the OLED, may be factors determining an amount of driving current Ids of the driving TFT. Therefore, all pixels should have the same electrical characteristics. However, a variation in the electrical characteristics between the pixels may be generated due to various causes such as process variation and time-varying characteristics. The variation in the electrical characteristics between the pixels may lead to deterioration in image quality and reduction in lifespan.

An internal compensation method and an external compensation method may be applied to compensate for such a variation in electrical characteristics of the driving TFT. The internal compensation method automatically compensates for the variation in the electrical characteristics of the driving TFT between the pixels using the gate-to-source voltage of the driving TFT varying depending on the electrical characteristics of the driving TFT. The external compensation method senses a voltage of the pixel varying depending on the electrical characteristics of the driving TFT and modulates data of an input image based on the sensed voltage using an external circuit, thereby compensating for the variation in the electrical characteristics of the driving TFT between the pixels.

SUMMARY

The present disclosure provides an electroluminescent display device and a method of driving the same capable of compensating for change in electrical characteristics of pixels in real time.

An electroluminescent display device according to the present disclosure comprises a display panel including a plurality of pixels connected to a plurality of data lines and a plurality of gate lines. Each pixel includes a driving element adjusting a current of a light emitting element depending on a gate-to-source voltage, and a switching element supplying a first supply voltage to the driving element in response to a gate-on voltage of an emission control signal, the switching element being turned off in response to a gate-off voltage of the emission control signal during a real-time compensation time. A source voltage of the driving element is changed for the real-time compensation time.

An electroluminescent display according to the present disclosure comprises a display panel including a plurality of data lines and a plurality of gate lines and a plurality of pixels, a data driver adding a compensation value to data of an input image, converting the data, to which the compensation value is added, into a data voltage, and outputting the data voltage to the data lines, and a gate driver generating a first scan signal, a second scan signal, and an emission control signal.

Each pixel includes a driving element adjusting a current of a light emitting element depending on a gate-to-source voltage, and a switching element supplying a first supply voltage to the driving element in response to a gate-on voltage of the emission control signal, the switching element being turned off in response to a gate-off voltage of the emission control signal during a real-time compensation time. A source voltage of the driving element is changed during the real-time compensation time, and mobility of the driving element and a temperature variation of the display panel are compensated. A variation in a threshold voltage of the driving element is compensated by the compensation value.

An electroluminescent display according to the present disclosure comprises a display panel including a plurality of data lines and a plurality of gate lines and a plurality of pixels. Each pixel includes an electroluminescent diode, a driving thin film transistor (TFT) adjusting a current of the electroluminescent diode depending on a gate-to-source voltage, a storage capacitor connected between a gate and a source of the driving TFT, a first switching TFT turned on in response to a gate-on voltage of a first scan signal and configured to connect the data line supplied with a data voltage to a first node of the pixel, a second switching TFT turned on in response to a gate-on voltage of a second scan signal and connected to a sensing line supplied with a reference voltage, and a third switching TFT turned on in response to a gate-on voltage of an emission control signal and configured to supply a first supply voltage to the source of the driving TFT. The third switching TFT is turned off in response to a gate-off voltage of the emission control signal during a real-time compensation time, and a source voltage of the driving TFT is changed during the real-time compensation time.

A method of driving an electroluminescent display including a driving element adjusting a current of a light emitting element of each pixel to a gate-to-source voltage according to the present disclosure comprises supplying a first supply voltage to the driving element in response to a gate-on voltage of an emission control signal, and blocking a path between the driving element and the first supply voltage using a switching element, that is turned off in response to a gate-off voltage of the emission control signal for a real-time compensation time. A source voltage of the driving element is changed during the real-time compensation time to compensate for an electron mobility of the driving element and a temperature variation of the display panel.

A method of driving an electroluminescent display including a driving element adjusting a current of a light emitting element of each pixel depending on a gate-to-source voltage according to the present disclosure comprises adding a previously set compensation value to data of an input image, converting the data, to which the compensation value is added, into a data voltage, and applying the data voltage to the pixel to compensate for a threshold voltage of the driving element, supplying a first supply voltage to the driving element in response to a gate-on voltage of an emission control signal, and blocking a path between the driving element and the first supply voltage using a switching element, that is turned off in response to a gate-off voltage of the emission control signal for a real-time compensation time, to compensate for a variation in mobility of the driving element and a temperature variation in real time.

BRIEF DESCRIPTION OF THE DRAWINGS

The accompanying drawings, which are included to provide a further understanding of the disclosure and are incorporated in and constitute a part of this specification, illustrate aspects of the disclosure and together with the description serve to explain the principles of the disclosure.

In the drawings.

DETAILED DESCRIPTION

Figure 1:
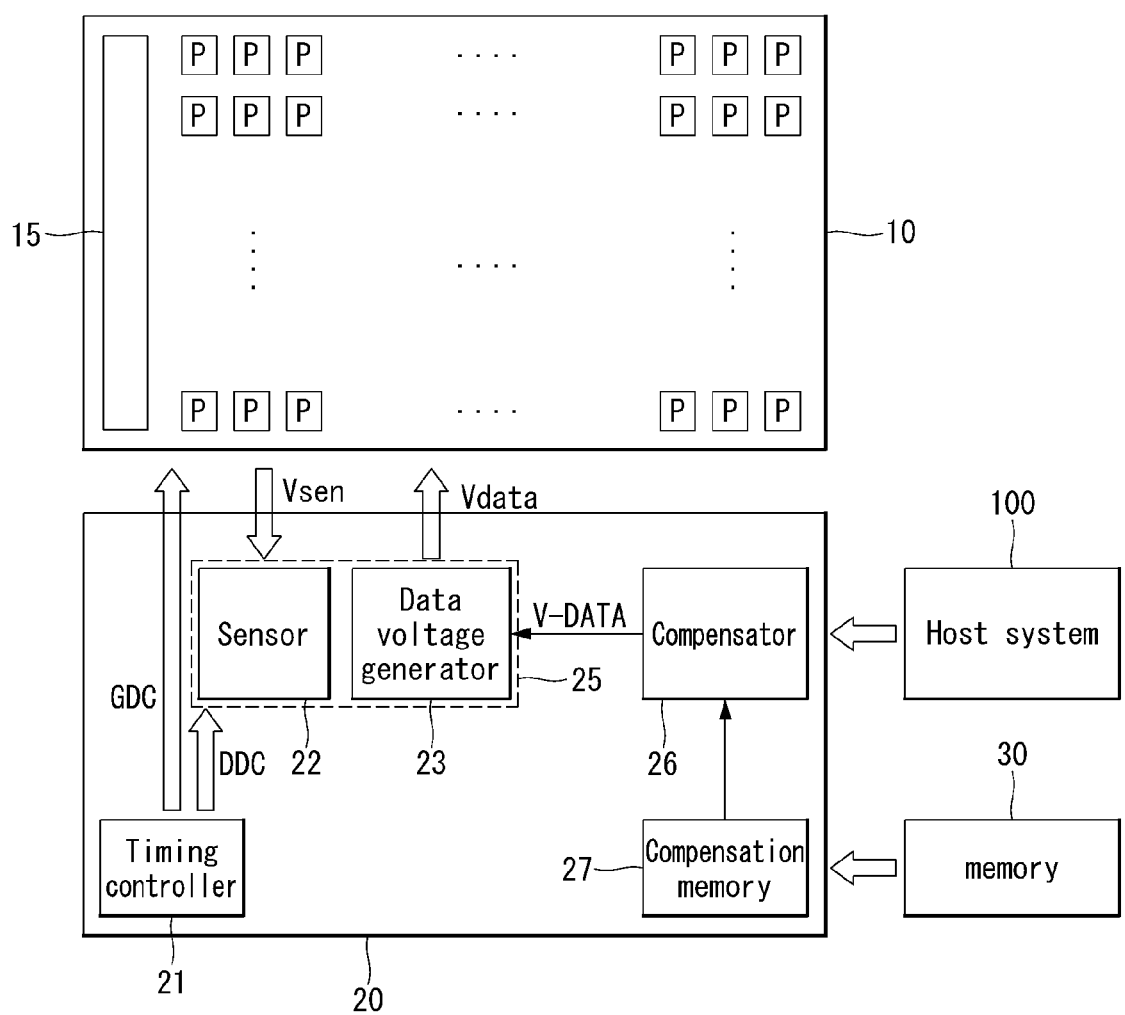
FIG. 1 is a block diagram of an electroluminescent display according to an aspect of the present disclosure.

Reference will now be made in detail to aspects of the present disclosure, examples of which are illustrated in the accompanying drawings. However, the present disclosure is not limited to aspects disclosed below, and may be implemented in various forms. These aspects are provided so that the present disclosure will be exhaustively and completely described, and will fully convey the scope of the present disclosure to those skilled in the art to which the present disclosure pertains. The present disclosure is only defined by the scope of the claims.

Shapes, sizes, ratios, angles, number, and the like illustrated in the drawings for describing aspects of the present disclosure are merely exemplary, and the present disclosure is not limited thereto. Like reference numerals designate like elements throughout. In the following description, when a detailed description of well-known functions or configurations related to this document is determined to unnecessarily cloud a gist of the disclosure, the detailed description thereof will be omitted.

In the present disclosure, when the terms "include", "have", "comprised of", etc. are used, other components may be added unless "~ only" is used. A singular expression can include a plural expression as long as it does not have an apparently different meaning in context.

In the explanation of components, even if there is no separate description, it is interpreted as including an error range.

In the description of position relationship, when a structure is described as being positioned "on or above", "under or below", "next to" another structure, this description should be construed as including a case in which the structures contact each other as well as a case in which a third structure is disposed therebetween.

The terms "first", "second", etc. may be used to describe various components, but the components are not limited by such terms. The terms are used only for the purpose of distinguishing one component from other components. For example, a first component may be designated as a second component without departing from the scope of the present disclosure.

The features of various aspects of the present disclosure can be partially combined or entirely combined with each other, and can be technically interlocking-driven in various ways. The aspects can be independently implemented, or can be implemented in conjunction with each other.

In aspects disclosed herein, a pixel circuit and a gate driver disposed on a substrate of a display panel may be implemented as a thin film transistor (TFT) of n-type or p-type metal oxide semiconductor field effect transistor (MOSFET) structure. Aspects describe a p-type TFT (e.g., a p-type MOSFET (PMOS)) by way of example. However, aspects are not limited thereto, and other types of TFTs may be used. The TFT is a three-electrode element including a gate, a source, and a drain. The source is an electrode for supplying carriers to the TFT. The carriers inside the TFT begin to flow from the source. The drain is an electrode from which the carriers exit the TFT. For example, carriers in the MOSFET flow from a source to a drain. In case of an n-type TFT (e.g., an n-type MOSFET (NMOS)), because carriers are electrons, a source voltage is less than a drain voltage so that electrons can flow from a source to a drain. In the n-type TFT, because electrons flow from the source to the drain, a current flows from the drain to the source. In case of a p-type TFT (e.g., a p-type MOSFET (PMOS)), because carriers are holes, a source voltage is greater than a drain voltage so that holes can flow from a source to a drain. In the p-type TFT, because holes flow from the source to the drain, a current flows from the source to the drain. In aspects disclosed herein, the source and the drain of the MOSFET are not fixed. For example, the source and the drain of the MOSFET may be changed depending on an applied voltage.

In the following description, a gate-on voltage is a voltage of a gate signal capable of turning on a TFT, and a gate-off voltage is a voltage of the gate signal capable of turning off a TFT. In the PMOS, the gate-on voltage is a gate low voltage VGL, and the gate-off voltage is a gate high voltage VGH. In the NMOS, the gate-on voltage is a gate high voltage VGH, and the gate-off voltage is a gate low voltage VGL.

Various aspects of the present disclosure will be described in detail below with reference to the accompanying drawings. In the following aspects, an electroluminescent display will be described focusing on an organic light emitting diode (OLED) display including an organic light emitting material. However, it should be noted that aspects of the present disclosure are not limited to the OLED display, and may be applied to an inorganic light emitting display including an inorganic light emitting material.

Figure 2:
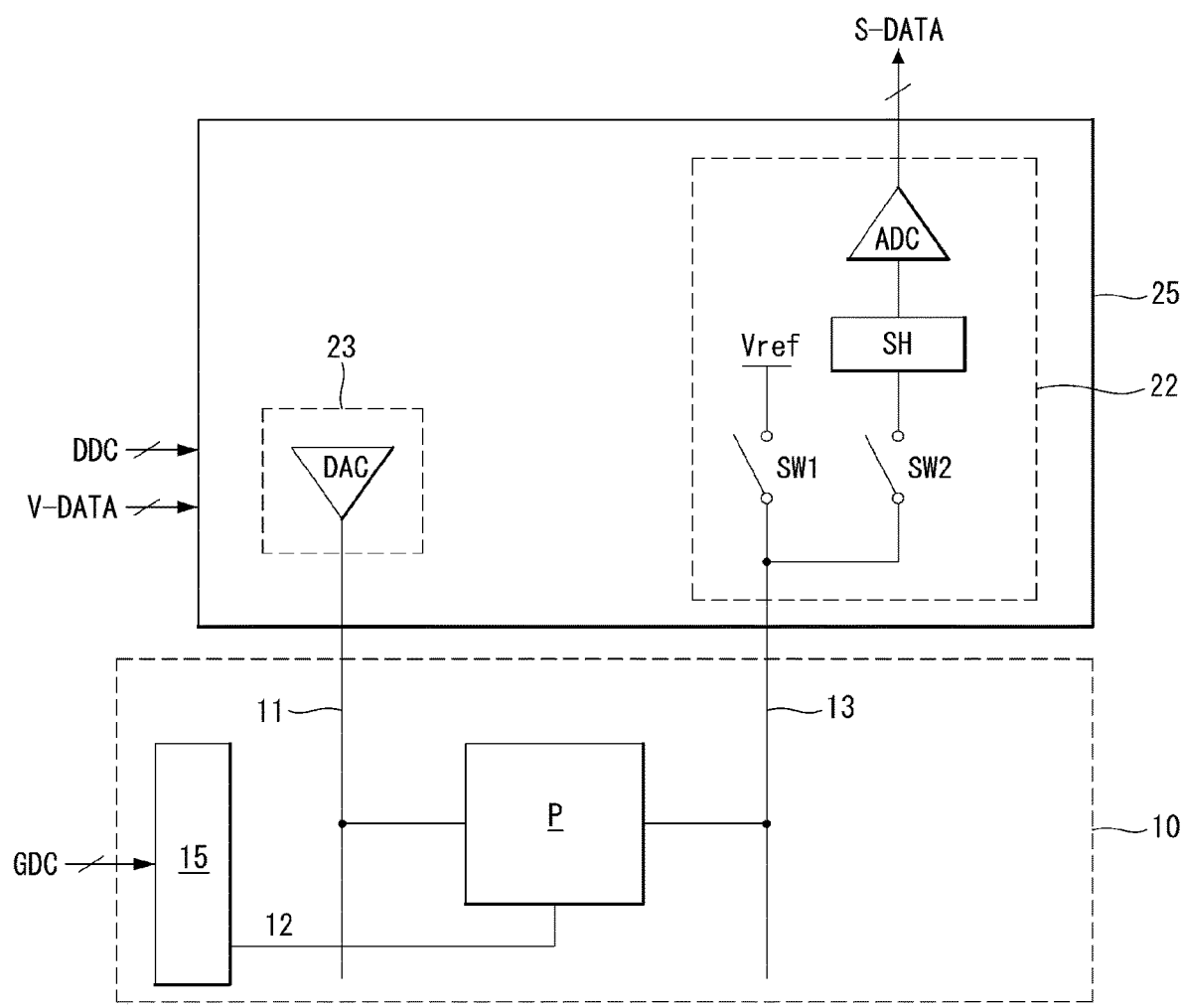
FIG. 2 is a circuit diagram illustrating an example of a sensing circuit.

Referring to FIGS. 1 and 2, an electroluminescent display according to an aspect includes a display panel 10, a driver integrated circuit (IC) 20, a host system 100, and a memory 30.

A screen of the display panel 10 reproducing an input image includes a plurality of pixels P connected to signal lines. Each pixel P includes red (R), green (G), and blue (B) subpixels, in order to represent full color. Each pixel P may further include a white subpixel in addition to the red (R), green (G), and blue (B) subpixels. Each subpixel includes a pixel circuit shown in FIG. 5A.

The signal lines may include data lines 11 supplying an analog data voltage Vdata to the pixels P and gate lines 12 supplying a gate signal to the pixels P. The gate signal may include two or more signals depending on configuration of the pixel circuit. In the pixel circuit shown in FIG. 5A, the gate signal may include a first scan signal SCAN1, a second scan signal SCAN2, and an emission control signal (hereinafter referred to as "EM signal") EM. The signal lines may further include sensing lines 13 to sense electrical characteristics of the pixels P.

The pixels P of the display panel 10 are disposed in a matrix to form a pixel array. Each pixel P may be connected to one of the data lines 11, one of the sensing lines 13, and at least one of the gate lines 12. Each pixel P is configured to receive a high potential power voltage VDD and a low potential power voltage VSS from a power generator. To this end, the power generator may supply the high potential power voltage VDD to the pixel P through a VDD line or a pad and may supply the low potential power voltage VSS to the pixel P through a VSS line or a pad. A high potential power voltage VDD may be referred to as a first supply voltage, and a low potential power voltage VSS may be referred to as a second supply voltage.

The driver IC 20 includes data driving circuits 22, 23, 26 and 27 and a timing controller 21. The data driving circuits 22, 23, 26 and 27 modulate data to a predetermined compensation value of the pixel P based on the result of sensing the electrical characteristics of the pixels P and generate a data voltage. The timing controller 21 controls operation timings of the data driving circuits 22, 23, 26 and 27 and a gate driver 15. The data driving circuits 22, 23, 26 and 27 add a predetermined compensation value to data of an input image to generate compensation data, convert the compensation data into the data voltage, and supply the data voltage to the data lines 11. The data driving circuits 22, 23, 26 and 27 may include a data driver 25, a compensator 26, and a compensation memory 27. The data driver 25 may include a sensor 22 and a data voltage generator 23. However, aspects are not limited thereto. In some aspects, the compensation memory 27 may be included in the memory 30. In some aspects, the compensator 26 may be configured to include the memory 30.

The timing controller 21 may generate a gate timing control signal GDC for controlling operation timing of the gate driver 15 and a data timing control signal DDC for controlling operation timing of the data driver 25 based on timing signals, for example, a vertical sync signal Vsync, a horizontal sync signal Hsync, a dot clock signal DCLK, and a data enable signal DE received from the host system 100.

The data timing control signal DDC may include a source start pulse, a source sampling clock, and a source output enable signal, and the like, but is not limited thereto. The source start pulse controls start timing of data sampling of the data voltage generator 23. The source sampling clock is a clock signal that controls the sampling timing of data based on a rising edge or a falling edge thereof. The source output enable signal controls output timing of the data voltage generator 23.

The gate timing control signal GDC may include a gate start pulse, a gate shift clock, and the like, but is not limited thereto. The gate start pulse is applied to a stage of the gate driver 15 for generating a first output and activates an operation of the stage. The gate shift clock is a clock signal that is commonly input to stages and shifts the gate start pulse.

The data voltage generator 23 generates a data voltage Vdata of an input image using a digital-to-analog converter (DAC) converting a digital signal into an analog signal in a normal driving mode, in which the input image is reproduced, and then supplies the data voltage Vdata to the pixels P through the data lines 11.

In a sensing mode in which a variation in electrical characteristics between the pixels P is measured before shipping the products or during a drive of the product, the data voltage generator 23 converts test data received from a grayscale-luminance measuring system to generate a sensing data voltage and supplies the sensing data voltage to pixels P to be sensed in the display panel 10 through the data lines 11. The grayscale-luminance measuring system senses electrical characteristics of each pixel P and obtains a compensation value (i.e., an offset) of the pixel P compensating for a variation in electrical characteristics between the pixels P (in particular, a variation in a threshold voltage of the driving TFT among the pixels P) based on a sensing result. The grayscale-luminance measuring system stores the compensation value of the pixel P in the memory 30 or updates a previously stored compensation value. The memory 30 may be a flash memory, but is not limited thereto.

The grayscale-luminance measuring system used in the sensing mode may be electrically connected to the memory 30 when the sensing mode operates.

In the normal driving mode, when power is applied to the electroluminescent display, the compensation value from the memory 30 is loaded to the internal compensation memory 27 of the driver IC 20. The compensation memory 27 of the driver IC 20 may be a double data rate synchronous dynamic random access memory (DDR SDRAM) or SRAM, but is not limited thereto.

The sensor 22 may be configured to sense the electrical characteristics of each pixels P, for example, the threshold voltage of the driving TFT in an aging process before shipping the products and transmit the electrical characteristics of each pixels P to the grayscale-luminance measuring system. For example, in case of an application such as a television, the sensor 22 may sense the electrical characteristics of each pixels P in the normal driving mode after the shipment of the products and may update the compensation value in real time. However, aspects are not limited to the application.

As shown in FIG. 2, the sensor 22 includes a sample and hold circuit SH, an analog-to-digital converter (ADC), and first and second switches SW1 and SW2. The sensor 22 may sample a source voltage of the driving TFT (i.e., a source voltage of the driving TFT stored in a capacitor connected to the sensing line 13) depending on a current of the driving TFT and sense electrical characteristics of the driving TFT. The first switch SW1 supplies a reference voltage Vref to the sensing line 13. The second switch SW2 is turned on at a sampling timing of an analog sensing voltage Vsen. The ADC converts the analog sensing voltages Vsen sampled by the sample and hold circuit SH into digital sensing data S-DATA. Aspects are not limited to the sensor 22 shown in FIG. 2. For example, the sensor 22 may be implemented as a known voltage sensing circuit or a known current sensing circuit.

The compensator 26 modulates data V-DATA of an input image to the compensation value read from the compensation memory 27 and transmits the compensation value to the data voltage generator 23.

The host system 100 may be one of a television system, a set-top box, a navigation system, a personal computer (PC), a home theater system, a mobile system, a wearable system, a virtual reality system, and other systems that include or operate in conjunction with a display. FIG. 1 illustrates an example where the host system is implemented as the mobile system. Configuration of the driving circuits of the display panel 10 may vary depending on the host system 100. The host system 100 may be implemented as an application processor in the mobile system, the wearable system, the virtual reality system, and the like.

A compensation value calculation algorithm for compensating for a variation in electrical characteristics between pixels is described below with reference to FIGS. 3 and 4A to 4C. In FIGS. 4A to 4C, the abscissa is voltage (V), and the ordinate is current (I).

Figure 3:
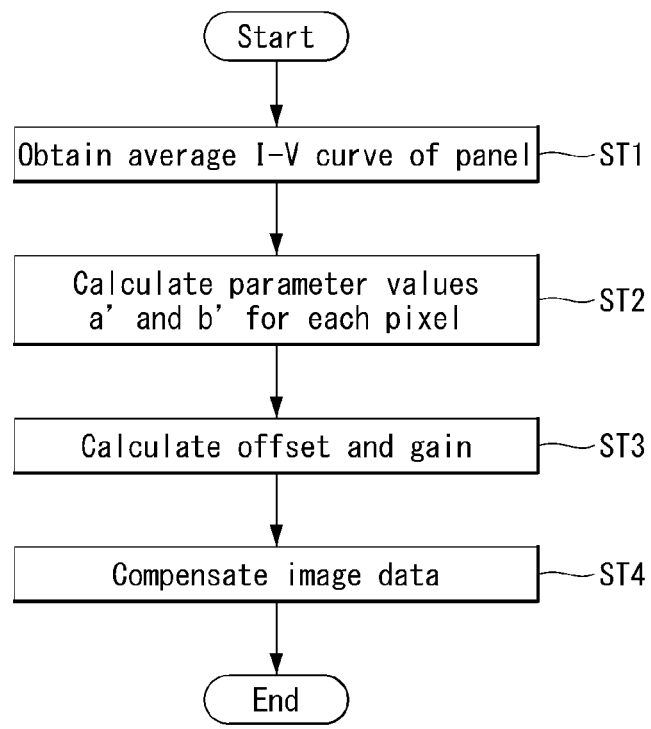
FIG. 3 is a flow chart illustrating an example of an external compensation method using a result of sensing driving characteristics of a pixel.
Figure 4A:
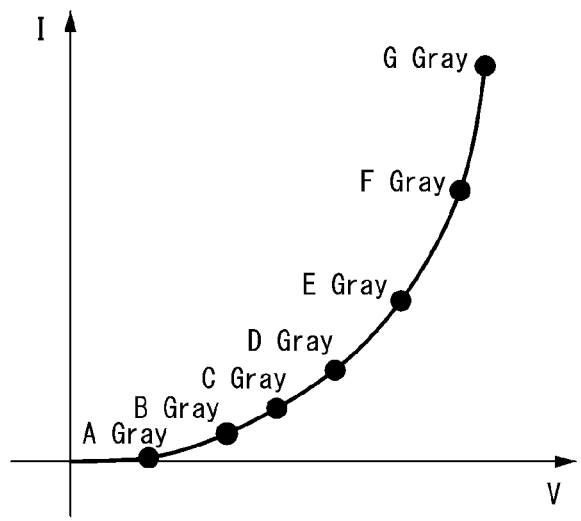
FIG. 4A illustrates an example of obtaining a reference curve.
Figure 4B:
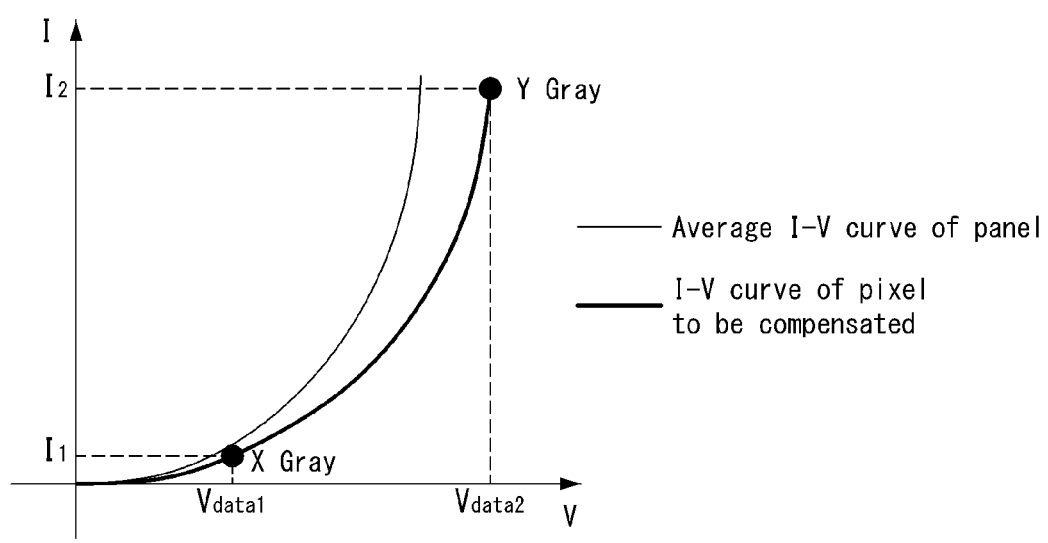
FIG. 4B illustrates an average I-V curve of a display panel and an I-V curve of a pixel to be compensated.
Figure 4C:
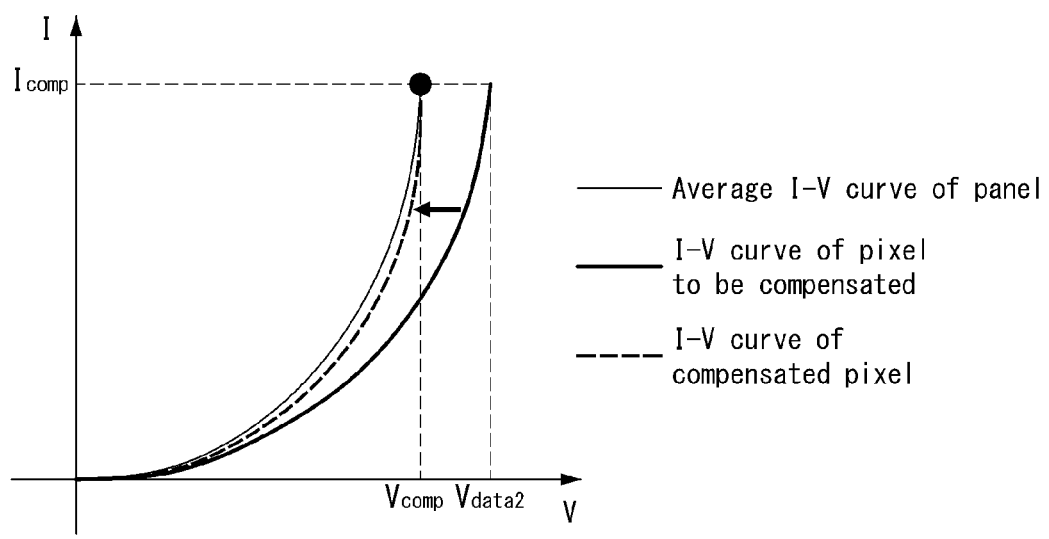
FIG. 4C illustrates an average I-V curve of a display panel, an I-V curve of a pixel to be compensated, and an I-V curve of a compensated pixel.

Referring to FIGS. 3 and 4A, the compensation value calculation algorithm senses electrical characteristics of pixels at a plurality of gray levels (for example, a total of seven gray levels A to G) and then obtains an average current (I)-voltage (V) curve of the display panel 10 based on a least square method as indicated by the following Equation 1 in step ST1. However, the least square method disclosed in an aspect is an example, and an aspect is not limited thereto. For example, a regression analysis method, a polynomial approximation method, etc. may be used.

$$I = a(V_{data} - b)^c \qquad \text{[Equation 1]}$$

where "a" is electron mobility of the driving TFT, "b" is a threshold voltage of the driving TFT, and "c" is a physical property value of the driving TFT.

Referring to FIGS. 3 and 4B, the compensation value calculation algorithm calculates parameter values a' and b' of a pixel to be sensed (or to be compensated) based on current values I1 and I2 and data voltage values Vdata1 and Vdata2 of digital level measured at two points of a low gray level X and a high gray level Y as indicated by the following Equation 2 in step ST2.

$$I_1 = a'(V_{data1} - b')^c$$

$$I_2 = a'(V_{data2} - b')^c \qquad \text{[Equation 2]}$$

In the above Equation 2, the parameter values a' and b' of a previously compensated pixel P can be calculated using a quadratic equation.

Referring to FIGS. 3 and 4C, the compensation value calculation algorithm calculates a pixel compensation value (i.e., an offset and a gain) for causing an I-V curve of the pixel to be sensed (or to be compensated) to coincide with the average I-V curve of the display panel (or all the pixels) in step ST3. The offset and the gain are expressed by the following Equation 3. In Equation 3, "Vcomp" is a compensation voltage. The offset $$b' - b\left(\frac{a}{a'}\right)^{\frac{1}{c}}$$

is a compensation value for compensating for a variation in a threshold voltage of the driving TFT. The gain $$\left(\frac{a}{a'}\right)^{\frac{1}{c}}$$

is a compensation value for compensating for a variation in mobility of the driving TFT.

$$V_{comp} = \left(\frac{a}{a'}\right)^{\frac{1}{c}} \times V_{data} + \left[b' - b\left(\frac{a}{a'}\right)^{\frac{1}{c}}\right] \qquad \text{[Equation 3]}$$

The compensator 26 adds the offset to data V-DATA of an input image to compensate for a variation in a threshold voltage of the driving TFT between the pixels. A variation in mobility of the driving TFT and a variation in temperature characteristic of the display panel are automatically compensated inside the pixel circuit of each pixel. Thus, an aspect of the present disclosure compensates for the variation in the threshold voltage of the driving TFT through an external compensation method and compensate for the mobility variation of the driving TFT and the temperature variation in real time using an internal compensation method in step ST4.

An aspect of the disclosure supplies the high potential power voltage VDD to the driving element using a switching element, that is turned on in response to a gate-on voltage of the EM signal EM and then blocks a path between the driving element and the high potential power voltage VDD using the switching element, that is turned off in response to a gate-off voltage of the EM signal EM for a predetermined real-time compensation time, in order to compensate for the mobility variation of the driving element (i.e., the driving TFT) and the temperature variation in real time. The mobility variation of the driving element and the temperature variation are compensated in real time every horizontal period by changing a source voltage of the driving element for the real-time compensation time.

The gate driver 15 generates a gate signal and sequentially supplies the gate signal to the gate lines 12. The gate driver 15 may be directly formed on a substrate of the display panel 10 together with the signal lines, the TFTs, etc. of the pixel array. The gate driver 15 includes a shift register that sequentially outputs the gate signal in response to the gate timing control signal GDC input through a level shifter. The gate timing control signal GDC includes a gate start pulse, N-phase gate shift clock, and the like, where N is an integer equal to or greater than 2. The level shifter converts a transistor-transistor logic (TTL) voltage level of the gate timing control signal GDC received from the timing controller 21 into a voltage (i.e., a gate high voltage and a gate low voltage) capable of turning on and off the TFT. A gate high voltage is referred to as a first gate voltage, and a gate low voltage is referred to as a second gate voltage.

Figure 5A:
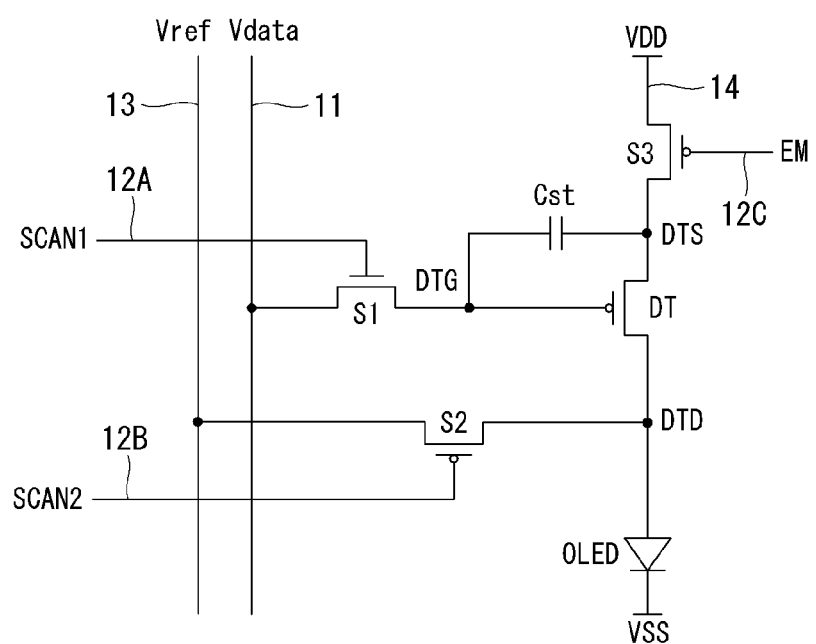
FIGS. 5A and 5B respectively illustrate a pixel circuit and a method of driving the same according to an aspect.
Figure 8:
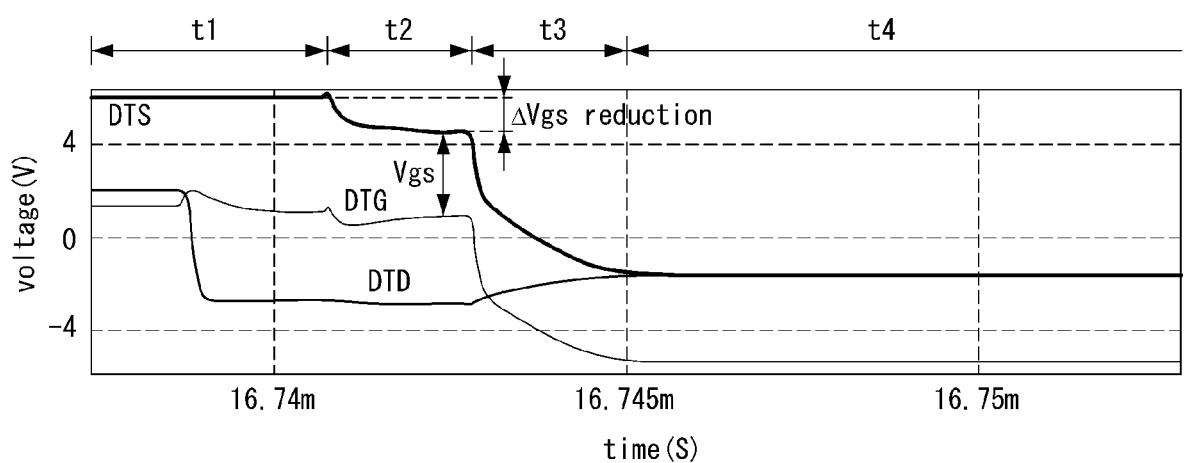
FIG. 8 illustrates a simulation result for verifying a real-time mobility compensation effect of a pixel circuit shown in FIG. 5A.
Figure 9A:
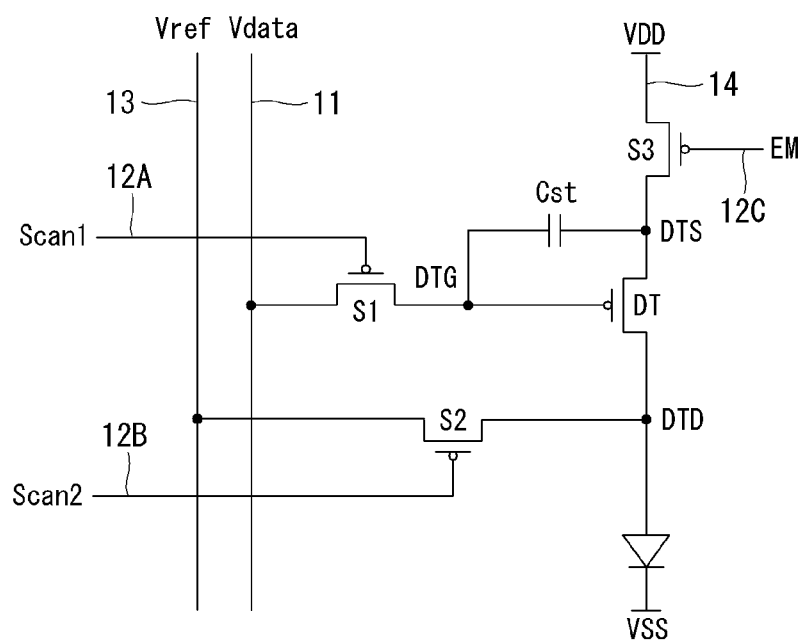
FIGS. 9A and 9B respectively illustrate a pixel circuit and a method of driving the same according to another aspect.

As shown in FIGS. 5A and 9A, each pixel in the electroluminescent display according to the aspect includes a driving element DT adjusting a current of a light emitting element (for example, an OLED) based on a gate-to-source voltage Vgs of the driving element DT and a switching element S3 supplying the high potential power voltage VDD to the driving element DT in response to the gate-on voltage of the EM signal. The timing controller 21 sets a real-time mobility compensation time t2, for which mobility of the driving element DT is compensated in real time in one horizontal period 1H, and turns off the switching element S3 by controlling the EM signal to the gate-off voltage for the real-time mobility compensation time t2, thereby inducing change in a source voltage of the driving element DT. This is described in detail below with reference to FIGS. 5A and 5B to 9A and 9B.

Figure 5B:
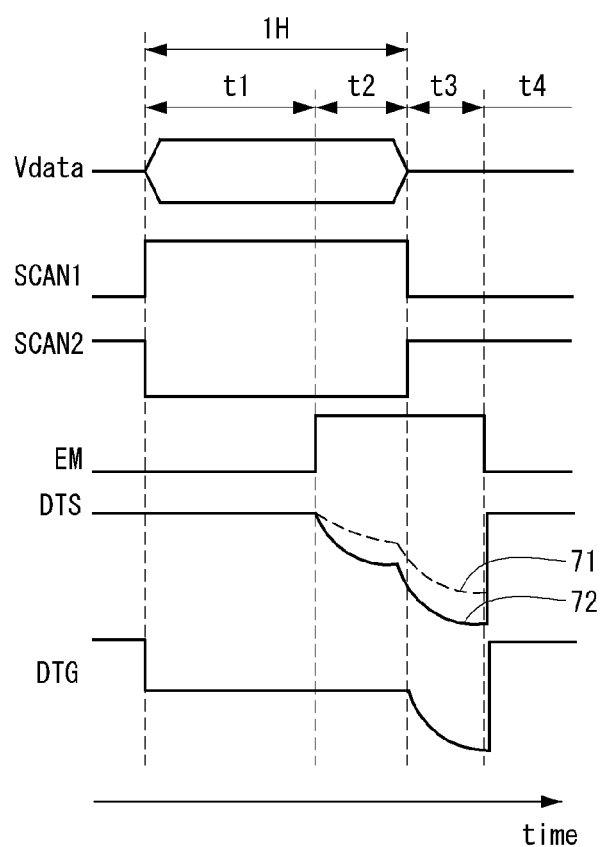
Figure 6:
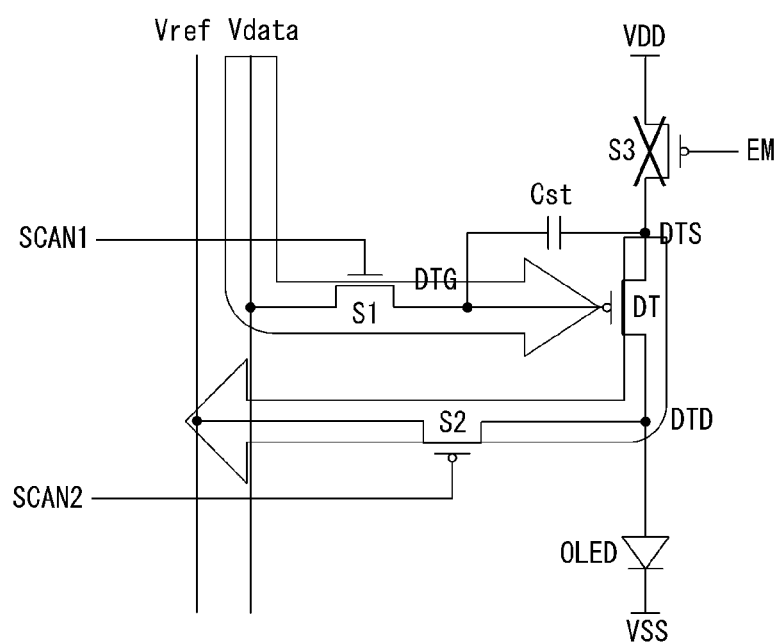
FIG. 6 illustrates a flow of a current in a pixel circuit shown in FIG. 5 during a real-time mobility compensation time.

FIGS. 5A and 5B respectively illustrate a pixel circuit and a method of driving the same according to an aspect of the disclosure. In FIG. 5B, "1H" indicates one horizontal period in which data is addressed to the pixel. FIG. 6 illustrates a flow of a current in a pixel circuit shown in FIG. 5A during a real-time mobility compensation time.

Referring to FIGS. 5A, 5B and 6, a pixel circuit may include an OLED, a driving TFT DT, a storage capacitor Cst, a first switching TFT S1, a second switching TFT S2, and a third switching TFT S3. The driving TFT DT, the second switching TFT S2, and the third switching TFT S3 may be implemented as a low temperature polysilicon (LTPS) PMOS (hereinafter, referred to as "LTPS PMOS") with high mobility. The first switching TFT S1 may be implemented as a LTPS PMOS or a NMOS (hereinafter, referred to as "oxide NMOS") including oxide semiconductor. However, an aspect is not limited thereto.

The electroluminescent display according to an aspect may drive the pixels at a low speed by reducing a frame rate, so as to reduce power consumption in a still image. In this instance, because a data update cycle becomes longer, a flicker may be seen when a leakage current is generated in the pixel. When the first switching TFT S1 having a long turn-off period is implemented as an oxide NMOS having a low off-current, a flicker phenomenon can decrease by reducing the leakage current of the pixel in a low-speed drive. The driving TFT DT is implemented as a LTPS PMOS with high mobility.

The first and second scan signals SCAN1 and SCAN2 and the EM signal EM are applied to the pixel circuit. The signals SCAN1, SCAN2 and EM each swings between the gate high voltage VGH and the gate low voltage VGL, as shown in FIG. 5B. The first and second scan signals SCAN1 and SCAN2 are generated at the gate-on voltage for times t1 and t2 of one frame period and are generated at the gate-off voltage for a remaining time excluding the times t1 and t2 from the one frame period. Because the first switching TFT S1 is the NMOS and the second switching TFT S2 is the PMOS, the first and second scan signals SCAN1 and SCAN2 are in antiphase.

Figure 7:
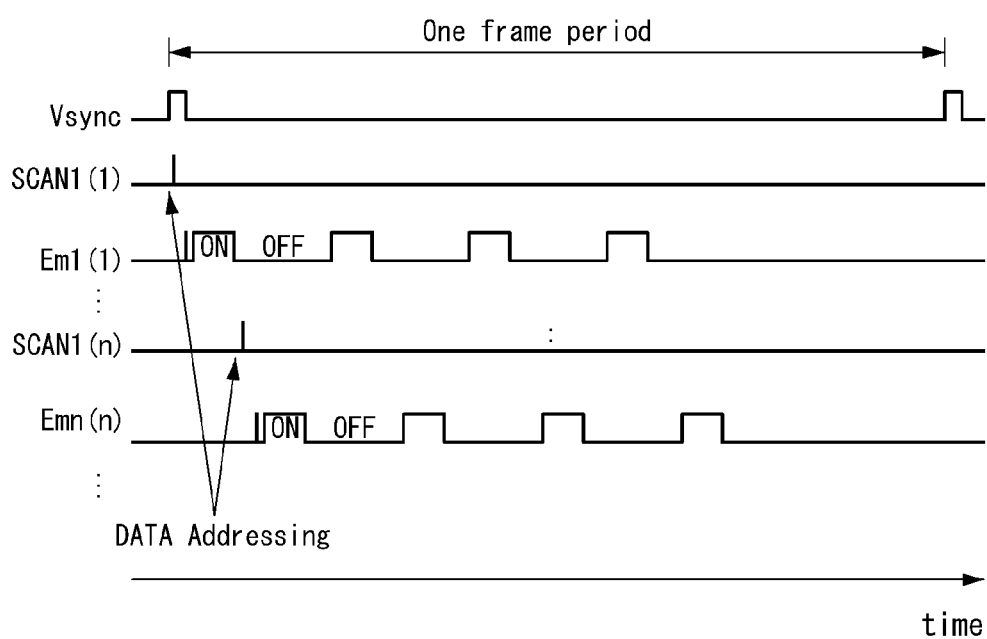
FIG. 7 is a waveform diagram illustrating an example where an EM signal is modulated at a PWM duty ratio equal to or less than 50% for an emission driving time of a pixel.

The EM signal EM is generated at the gate-on voltage for the time t1 and is generated at the gate-off voltage for times t2 and t3. As shown in FIG. 7, the EM signal EM switches between an on-state and an off-state of the pixels at a predetermined pulse width modulation (PWM) duty ratio for a time t4. When the pixels are repeatedly turned on and off at a duty ratio of about 20% to 90% (for example, at a duty ratio of about 50%) by the EM signal EM for the emission driving time t4 of the pixel, the flicker and the image sticking can be prevented or reduced. An aspect of the disclosure is not limited to a particular duty ratio.

The gate-on voltage of the first scan signal SCAN1 is the gate high voltage VGH, and the gate-off voltage of the first scan signal SCAN1 is the gate low voltage VGL less than the gate high voltage VGH. On the other hand, the gate-on voltage of the second scan signal SCAN2 and the gate-on voltage of the EM signal EM are the gate low voltage VGL, and the gate-off voltage of the second scan signal SCAN2 and the gate-off voltage of the EM signal EM are the gate high voltage VGH.

The OLED includes an organic compound layer between an anode and a cathode. The organic compound layer may include a hole injection layer HIL, a hole transport layer HTL, an emission layer EML, an electron transport layer ETL, and an electron injection layer EIL. However, an aspect of the disclosure is not limited thereto. The cathode of the OLED is connected to an input terminal of the low potential power voltage VSS, and the anode of the OLED is connected to a drain of the driving TFT DT through a third node DTD.

The driving TFT DT controls a current flowing in the OLED depending on a gate-to-source voltage Vgs. The driving TFT DT includes a gate connected to a first node DTG, a source connected to a second node DTS, and the drain connected to the third node DTD. The storage capacitor Cst is connected between the first node DTG and the second node DTS.

The first switching TFT S1 is turned on in response to the first scan signal SCAN1 from a first gate line 12A for the times t1 and t2 and supplies the data voltage Vdata to the first node DTG. The first switching TFT S1 includes a gate connected to the first gate line 12A, a source connected to the first node DTG, and a drain connected to the data line 11.

The second switching TFT S2 is turned on in response to the second scan signal SCAN2 from a second gate line 12B for the times t1 and t2 and forms a current path between the sensing line 13 and the third node DTD. The second switching TFT S2 includes a gate connected to the second gate line 12B, a source connected to the sensing line 13, and a drain connected to the third node DTD.

The third switching TFT S3 is turned on in response to the gate-on voltage of the EM signal EM from a third gate line 12C and supplies the high potential power voltage VDD on a VDD line 14 to the second node DTS for the ON-times t1 and t4. The third switching TFT S3 is turned off in response to the gate-off voltage of the EM signal EM from the third gate line 12C and blocks a current path between the VDD line 14 and the second node DTS for the OFF-times t2 and t3.

An operation of the pixel circuit is described in stages.

For an initialization time t1, all the switching TFTs S1, S2 and S3 are turned on in response to the gate-on voltages of the first and second scan signals SCAN1 and SCAN2 and the gate-on voltage of the EM signal EM. In this instance, the data voltage Vdata is applied to the first node DTG. For the initialization time t1, the second node DTS is initialized to the high potential power voltage VDD, and the third node DTD is initialized to the reference voltage Vref. For the initialization time t1, the driving TFT DT is turned on because a source voltage of the driving TFT DT is greater than a gate voltage by a threshold voltage or more.

Subsequently, for a real-time mobility compensation time t2, the first and second switching TFTs S1 and S2 maintain an ON-state as the first and second scan signals SCAN1 and SCAN2 are held at the gate-on voltage. On the other hand, the third switching TFT S3 is turned off in response to the gate-off voltage of the EM signal EM. In this instance, a current path of the pixel circuit is as shown in FIG. 6. For the real-time mobility compensation time t2, the second node DTS connected to the source of the driving TFT DT is floated, and thus a discharge amount of the source voltage of the driving TFT DT varies depending on the mobility of the driving TFT DT.

When there is a variation in mobility of the driving TFT DT between the pixels, a pixel including a driving TFT DT of high mobility and a pixel including a driving TFT DT of low mobility may be respectively seen as a relatively bright pixel and a relatively dark pixel at the same gray level. And, when a temperature of the pixel is high, an I-V transfer curve of the driving TFT DT is shifted to the negative direction. In this case, a current of the driving TFT DT increases. For example, when the mobility of the driving TFT DT is high or the use temperature of the pixel is high, uniform image quality cannot be obtained because a luminance of the pixel increases.

Aspects change the source voltage of the driving TFT DT of each pixel P depending on the mobility of the driving TFT DT for the real-time mobility compensation time t2, thereby compensating for a variation in the mobility of the driving TFT DT and a variation in the temperature between the pixels P in real time. A source voltage of the driving TFT DT with high mobility is relatively more discharged due to a large amount of source-to-drain current for the real-time mobility compensation time t2, and thus a decrease of a change ΔVgs in a gate-to-source voltage Vgs of the driving TFT DT of the high mobility is large. On the other hand, a source voltage of the driving TFT DT with low mobility is relatively less discharged due to a small amount of source-to-drain current for the real-time mobility compensation time t2, and thus a decrease of a change ΔVgs in a gate-to-source voltage Vgs is small. A luminance of the pixel is determined depending on a current of the OLED proportional to the Vgs of the driving TFT DT. Thus, a luminance of a pixel including a driving TFT DT of high mobility decreases due to the large decrease of the change ΔVgs in the Vgs of the driving TFT DT for the real-time mobility compensation time t2. On the other hand, a luminance of a pixel including a driving TFT DT of low mobility little decreases due to the small decrease of change ΔVgs in the Vgs of the driving TFT DT for the real-time mobility compensation time t2. The variation in the mobility of the driving TFT DT can be uniformly compensated throughout the entire screen. In FIG. 5, "71" is a source discharge voltage of the second node DTS (i.e., the driving TFT DT) in the pixel including the driving TFT DT of the low mobility, and "72" is a source discharge voltage of the second node DTS (i.e., the driving TFT DT) in the pixel including the driving TFT DT of the high mobility.

A current of the driving TFT DT is proportional to a temperature of the pixel. For this reason, the decrease of the change ΔVgs in the Vgs of the driving TFT DT in a pixel having a high temperature is greater than that in a pixel having a low temperature for the real-time mobility compensation time t2. Hence, a luminance variation between the pixels resulting from a temperature difference can be compensated.

During a kickback time t3, the first scan signal SCAN1 changes from the VGH to the VGL. A voltage between the gate and the source of the driving TFT DT (i.e., a voltage between the first node DTG and the second node DTS) temporarily decreases due to a charge coupling effect resulting from a voltage change in the first scan signal SCAN1. Subsequently, for an emission driving time t4, the first scan signal SCAN1 is held at the VGL, and the source voltage of the driving TFT DT is restored to the VDD.

As shown in FIG. 7, for the emission driving time t4, the EM signal EM alternates between the gate-on voltage and the gate-off voltage at a predetermined PWM duty ratio (unit:%). The EM signal EM switches on and off the current of the OLED and repeatedly turns on and off the pixel at a PWM duty ratio of the EM signal EM for the emission driving time t4.

FIG. 7 is a waveform diagram illustrating an example where an EM signal is modulated at a PWM duty ratio equal to or less than 50% for an emission driving time of a pixel. In FIG. 7, "SCAN1(1)" and "Em1(1)" are the first scan signal and the EM signal applied to the pixels arranged on a first line of the display panel 10, respectively. "SCAN1($n$)" and "Em1($n$)" are the first scan signal and the EM signal applied to the pixels arranged on a nth line of the display panel 10, respectively.

FIG. 8 illustrates a simulation result for verifying a real-time mobility compensation effect of the pixel circuit shown in FIG. 5A. In the simulation result shown in FIG. 8, voltages applied to the pixel circuit were set as follows: VDD=6V, VSS=−4V, Vref=−3V, and Vdata=0 to 5.8V. The voltages of the pixel circuit may be changed in an actual product.

Figure 9B:
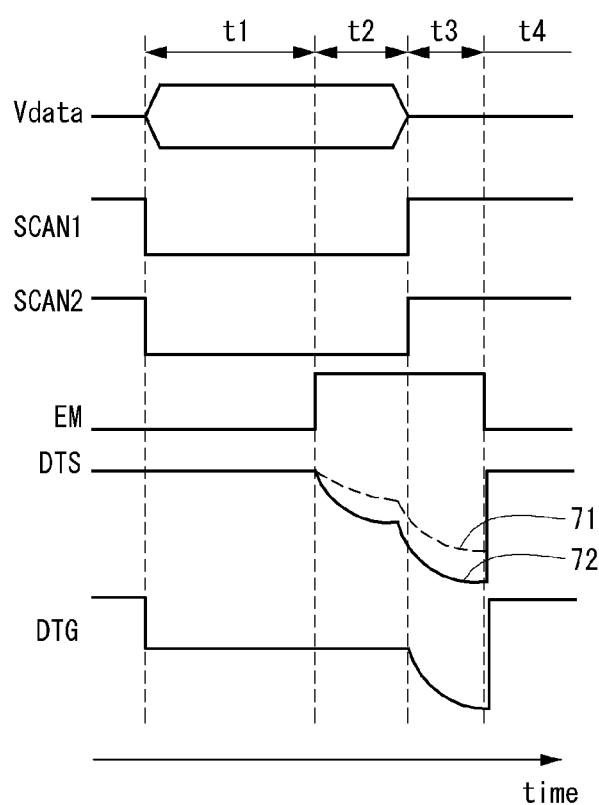

FIGS. 9A and 9B respectively illustrate a pixel circuit and a method of driving the same according to another aspect of the present disclosure. Configuration of the pixel circuit shown in FIG. 9A is substantially the same as the pixel circuit shown in FIG. 5A, except that a first switching TFT S1 is implemented as a LTPS PMOS, and as shown in FIG. 9B, a gate-on voltage and a gate-off voltage of a first scan signal SCAN1 controlling the first switching TFT S1 are opposite to the gate-on voltage and the gate-off voltage shown in FIG. 5B. And, since an operation of the pixel circuit illustrated in FIG. 9A is substantially the same as the operation of the pixel circuit illustrated in FIGS. 5A to 7, a further description may be briefly made or may be omitted.

Figure 10:
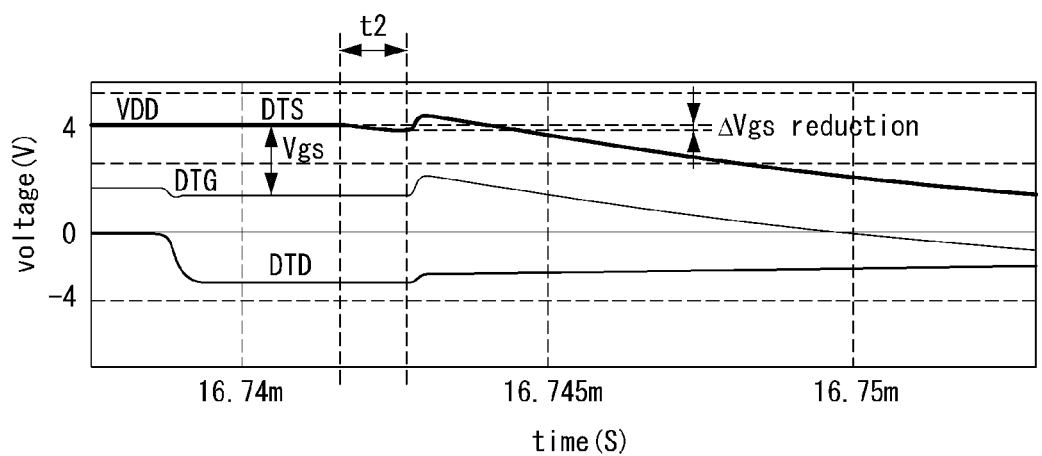
FIG. 10 illustrates a simulation result for verifying a real-time mobility compensation effect of a pixel circuit shown in FIG. 9A.

FIG. 10 illustrates a simulation result for verifying a real-time mobility compensation effect of a pixel circuit shown in FIG. 9A. As can be seen from FIG. 10, when the first switching TFT S1 is implemented as the LTPS PMOS, an output voltage range of a data voltage generator 23 may decrease, compared to the first switching TFT S1 implemented as an oxide NMOS. Hence, a real-time mobility compensation time t2 may be reduced. And, an aspect of the disclosure is not limited thereto.

As described above, aspects of the present disclosure control the floating of the driving element for a predetermined real-time compensation time and change the source voltage of the driving element, thereby compensating for the mobility variation of the driving element and the temperature variation. Hence, the image quality of the electroluminescent display can be improved.

Aspects of the present disclosure add the compensation value of the pixel obtained based on the result of sensing electrical characteristics of the pixels to data of an input image and compensate for the threshold voltage of the driving element. Hence, the image quality of the electroluminescent display can be improved.

Aspects of the present disclosure modulate the emission control signal at the PWM duty ratio for the emission driving time, thereby preventing the flicker and the image sticking. Hence, the image quality of the electroluminescent display can be improved.

An electroluminescent display according to an aspect of the present disclosure may be described as follows.

An electroluminescent display device according to an aspect of the present disclosure comprises a display panel including a plurality of pixels connected to a plurality of data lines and a plurality of gate lines. Each pixel includes a driving element adjusting a current of a light emitting element depending on a gate-to-source voltage, and a switching element supplying a high potential power voltage to the driving element in response to a gate-on voltage of an emission control signal, the switching element being turned off in response to a gate-off voltage of the emission control signal during a real-time compensation time. A source voltage of the driving element is changed during the real-time compensation time.

According to one or more aspects, the electroluminescent display device may further comprise a data driver adding a previously set compensation value to data of an input image, converting the data, to which the compensation value is added, into a data voltage, and outputting the data voltage to the data lines, the data driver including a sensing circuit sensing electrical characteristics of the pixels, and a gate driver generating a first scan signal, a second scan signal, and the emission control signal.

According to one or more aspects, each pixel may further include a first switching element supplying the data voltage of the input image to a gate of the driving element in response to a gate-on voltage of the first scan signal, a second switching element supplying a reference voltage to a drain of the driving element in response to a gate-on voltage of the second scan signal, and a storage capacitor connected between the gate and a source of the driving element. The light emitting element may include an anode connected to the drain of the driving element and a cathode supplied with a low potential power voltage.

According to one or more aspects, the first scan signal may be the gate-on voltage for first and second times of one horizontal period and then may be a gate-off voltage after a third time. The second scan signal may be the gate-on voltage for the first and second times and then may be a gate-off voltage after the third time. And the emission control signal may be the gate-on voltage for the first time and may be the gate-off voltage for the second and third times.

According to one or more aspects, the first switching element may be an n-type transistor. And switching elements other than the first switching element and the driving element may be p-type transistors.

According to one or more aspects, the gate-on voltage of the first scan signal is a gate high voltage, and the gate-off voltage of the first scan signal may be a gate low voltage less than the gate high voltage. And the gate-on voltages of the second scan signal and the emission control signal may be the gate low voltage, and the gate-off voltages of the second scan signal and the emission control signal may be the gate high voltage.

According to one or more aspects, all of the switching elements and the driving element may be p-type transistors.

According to one or more aspects, the gate-on voltages of the first scan signal, the second scan signal, and the emission control signal may be a gate low voltage, and the gate-off voltages of the first scan signal, the second scan signal, and the emission control signal may be a gate high voltage greater than the gate low voltage.

An electroluminescent display device according to an aspect of the present disclosure comprises a display panel including a plurality of data lines and a plurality of gate lines and a plurality of pixels, a data driver adding a compensation value to data of an input image, converting the data, to which the compensation value is added, into a data voltage, and outputting the data voltage to the data lines, and a gate driver generating a first scan signal, a second scan signal, and an emission control signal. Each pixel includes a driving element adjusting a current of a light emitting element depending on a gate-to-source voltage, and a switching element supplying a high potential power voltage to the driving element in response to a gate-on voltage of the emission control signal, the switching element being turned off in response to a gate-off voltage of the emission control signal during a real-time compensation time. A source voltage of the driving element is changed during the real-time compensation time, and mobility of the driving element and a temperature variation of the display panel are compensated. A variation in a threshold voltage of the driving element is compensated by the compensation value.

According to one or more aspects, the data driver may include a sensing circuit sensing electrical characteristics of the pixels.

According to one or more aspects, each pixel may further include a first switching element supplying the data voltage of the input image to a gate of the driving element in response to a gate-on voltage of the first scan signal, a second switching element supplying a reference voltage to a drain of the driving element in response to a gate-on voltage of the second scan signal, and a storage capacitor connected between the gate and a source of the driving element. The light emitting element may include an anode connected to the drain of the driving element and a cathode supplied with a low potential power voltage.

According to one or more aspects, the electroluminescent display device may further comprise a storage capacitor connected between the gate and a source of the driving element. The light emitting element may include an anode connected to the drain of the driving element and a cathode supplied with a second supply voltage.

According to one or more aspects, the first scan signal may be the gate-on voltage for first and second times of one horizontal period and then may be a gate-off voltage after a third time. The second scan signal may be the gate-on voltage for the first and second times and then may be a gate-off voltage after the third time, and the emission control signal may be the gate-on voltage for the first time and may be the gate-off voltage for the second and third times.

An electroluminescent display device according to the present disclosure comprises a display panel including a plurality of data lines and a plurality of gate lines and a plurality of pixels. Each pixel includes an electroluminescent diode, a driving thin film transistor (TFT) adjusting a current of the electroluminescent diode depending on a gate-to-source voltage, a storage capacitor connected between a gate and a source of the driving TFT, a first switching TFT turned on in response to a gate-on voltage of a first scan signal and configured to connect the data line supplied with a data voltage to a first node of the pixel, a second switching TFT turned on in response to a gate-on voltage of a second scan signal and connected to a sensing line supplied with a reference voltage, and a third switching TFT turned on in response to a gate-on voltage of an emission control signal and configured to supply a high potential power voltage to the source of the driving TFT. The third switching TFT is turned off in response to a gate-off voltage of the emission control signal during a real-time compensation time, and a source voltage of the driving TFT is changed during the real-time compensation time.

According to one or more aspects, the first scan signal may be the gate-on voltage for first and second times of one horizontal period and then may be a gate-off voltage after a third time. The second scan signal may be generated at the gate-on voltage for the first and second times and then may be a gate-off voltage after the third time, and the emission control signal may be the gate-on voltage for the first time and may be the gate-off voltage for the second and third times.

According to one or more aspects, the first switching TFT may be an n-type transistor, and switching TFTs other than the first switching TFT and the driving TFT may be p-type transistors.

According to one or more aspects, all of the switching TFTs and the driving TFT may be p-type transistors.

According to one or more aspects, the electroluminescent display device may further comprises a data driver adding a previously set compensation value to data of an input image, converting the data, to which the compensation value is added, into a data voltage, and outputting the data voltage to the data lines, the data driver including a sensing circuit sensing electrical characteristics of the pixels, and a gate driver generating the first scan signal, the second scan signal, and the emission control signal.

A method of driving an electroluminescent display device including a driving element adjusting a current of a light emitting element of each pixel to a gate-to-source voltage according to the present disclosure comprises supplying a high potential power voltage to the driving element in response to a gate-on voltage of an emission control signal, and blocking a path between the driving element and the high potential power voltage using a switching element, that is turned off in response to a gate-off voltage of the emission control signal during a real-time compensation time. A source voltage of the driving element is changed during the real-time compensation time to compensate for an electron mobility of the driving element and a temperature variation of the display panel.

A method of driving an electroluminescent display device including a driving element adjusting a current of a light emitting element of each pixel depending on a gate-to-source voltage according to the present disclosure comprises adding a previously set compensation value to data of an input image, converting the data, to which the compensation value is added, into a data voltage, and applying the data voltage to the pixel to compensate for a threshold voltage of the driving element, supplying a high potential power voltage to the driving element in response to a gate-on voltage of an emission control signal, and blocking a path between the driving element and the high potential power voltage using a switching element, that is turned off in response to a gate-off voltage of the emission control signal during a real-time compensation time, to compensate for a variation in mobility of the driving element and a temperature variation in real time.

Although aspects have been described with reference to a number of illustrative aspects thereof, it should be understood that numerous other modifications and aspects can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An electroluminescent display device having, comprising:
   a display panel including a plurality of pixels connected to a plurality of data lines and a plurality of gate lines;
   a data driver including a sensing circuit sensing electrical characteristics of the pixels, the data driver configured for generating a compensation value based on the sensed electrical characteristics, adding the compensation value into data of an input image, converting the data to which the compensation value is added into a data voltage, and outputting the data voltage to the data lines; and
   a gate driver generating a first scan signal, a second scan signal, and an emission control signal,
   wherein each pixel comprises:
   a driving element adjusting a current of a light emitting element depending on a gate-to-source voltage;
   a first switching element supplying the data voltage of the input image to a gate of the driving element in response to a gate-on voltage of the first scan signal during one horizontal period including a first period and a second period following the first period;
   a second switching element supplying a reference voltage to a drain of the driving element in response to the gate-on voltage of the second scan signal during the first and second periods, the first and second switching elements being turned off in response to a gate-off voltage of the first and second scan signals during a third period following the second period; and a third switching element supplying a first voltage to a source of the driving element in response to the gate-on voltage of an emission control signal during the first period, the switching element being turned off in response to the gate-off voltage of the emission control signal during the second and third periods, wherein the source of the driving element is floated and a source voltage of the driving element is changed during the second period.

2. The electroluminescent display device of claim 1, further comprising a storage capacitor connected between the gate and the source of the driving element, wherein the light emitting element includes an anode connected to the drain of the driving element and a cathode supplied with a second voltage.

3. The electroluminescent display device of claim 1, wherein the first switching element includes an n-type transistor, and the second switching element and the driving element include a p-type transistor.

4. The electroluminescent display device of claim 3, wherein the gate-on voltage of the first scan signal is a first gate voltage, and the gate-off voltage of the first scan signal is a second gate voltage less than the first gate voltage, wherein the gate-on voltages of the second scan signal and the emission control signal are the second gate voltage, and the gate-off voltages of the second scan signal and the emission control signal are the first gate voltage.

5. The electroluminescent display device of claim 1, wherein the first and second switching elements and the driving element include a p-type transistor.

6. The electroluminescent display device of claim 5, wherein the gate-on voltages of the first scan signal, the second scan signal, and the emission control signal are a second gate voltage, and the gate-off voltages of the first scan signal, the second scan signal, and the emission control signal are a first gate voltage greater than the second gate voltage.

7. The electroluminescent display device of claim 2, wherein during the second period the gate-to-source voltage of the driving element is changed, and during the third period, a gate voltage and the source voltage of the driving element are lowered and the gate-to-source voltage of the driving element is not changed.

8. The electroluminescent display device of claim 7, wherein during a fourth period following the third period, the first and second switching elements are turned off in response to the gate-off voltage of the first and second scan signals and the third switching element is turned on in response to the gate-on voltage of an emission control signal during a fourth period following the third period so that the light emitting element emits light.

9. The electroluminescent display device of claim 1, wherein the change in the gate-to-source voltage of the driving element compensates for an electron mobility of the driving element and a temperature variation of the display panel in real time.

10. The electroluminescent display device of claim 9, wherein the change in the gate-to-source voltage of the driving element with low mobility is relatively less than the change in the gate-to-source voltage of the driving element with high mobility.

11. The electroluminescent display device of claim 9, wherein a variation in a threshold voltage of the driving element is compensated by the compensation value.

12. A method of driving an electroluminescent display device including a driving element adjusting a current of a light emitting element of each pixel depending on a gate-to-source voltage of a driving element included in a pixel of a display panel, the method comprising:

sensing electrical characteristics of the pixel and generating a compensation value based on the sensed electrical characteristics;

adding the compensation value to data of an input image, and converting the data, to which the compensation value is added, into a data voltage, and applying the data voltage to the pixel to compensate for a threshold voltage of the driving element during one horizontal period including a first period and a second period following the first period;

supplying a first supply voltage to a source of the driving element in response to a gate-on voltage of an emission control signal during the first period; and blocking a path between the driving element and the first supply voltage using a switching element that is turned off in response to a gate-off voltage of the emission control signal during the second period, to compensate for a variation in electron mobility of the driving element and a temperature variation in real time, wherein the source of the driving element is floated and a source voltage of the driving element is changed during the second period.

13. The method of claim 12, further comprising:

making a light emitting element connected to a drain of the driving element emit light during a period following the second period.

* * * * *